United States Patent
Moriceau et al.

(10) Patent No.: US 9,427,948 B2
(45) Date of Patent: Aug. 30, 2016

(54) MANUFACTURING A FLEXIBLE STRUCTURE BY TRANSFERS OF LAYERS

(71) Applicant: COMMISSARIAT A L'ENERGIE ATOMIQUE ET AUX ENERGIES ALTERNATIVES, Paris (FR)

(72) Inventors: Hubert Moriceau, Saint-Egreve (FR); Maxime Argoud, Lyons (FR); Frank Fournel, Villard-Bonnot (FR); Frederic Mazen, Grenoble (FR); Christophe Morales, St Pierre de Mesage (FR)

(73) Assignee: COMMISSARIATE A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 742 days.

(21) Appl. No.: 13/718,037

(22) Filed: Dec. 18, 2012

(65) Prior Publication Data
US 2013/0156989 A1 Jun. 20, 2013

(30) Foreign Application Priority Data
Dec. 20, 2011 (FR) .................................. 11 62086

(51) Int. Cl.
| | |
|---|---|
| *B44C 1/165* | (2006.01) |
| *B44C 1/17* | (2006.01) |
| *B29C 65/52* | (2006.01) |
| *B32B 37/14* | (2006.01) |
| *B32B 37/26* | (2006.01) |
| *B32B 38/10* | (2006.01) |
| *H01L 21/762* | (2006.01) |
| *B32B 3/02* | (2006.01) |
| *B32B 7/02* | (2006.01) |

(52) U.S. Cl.
CPC ................. *B32B 38/10* (2013.01); *B32B 3/02* (2013.01); *B32B 7/02* (2013.01); *H01L 21/76254* (2013.01); *Y10T 428/21* (2015.01); *Y10T 428/24942* (2015.01); *Y10T 428/24967* (2015.01)

(58) Field of Classification Search
USPC ............... 156/230, 235, 239, 241, 247, 249; 428/64.1, 212, 215, 409, 543
See application file for complete search history.

(56) References Cited

U.S. PATENT DOCUMENTS

| | | | | |
|---|---|---|---|---|
| 6,054,363 | A * | 4/2000 | Sakaguchi | ........ H01L 21/76259 257/E21.57 |
| 2004/0224482 | A1* | 11/2004 | Kub | .................. H01L 21/76254 438/458 |
| 2006/0177971 | A1* | 8/2006 | Kokubo | ................ H01L 21/486 438/119 |
| 2011/0270067 | A1* | 11/2011 | Faraji | ................. A61B 5/04001 600/377 |

\* cited by examiner

*Primary Examiner* — Sing P Chan
(74) *Attorney, Agent, or Firm* — Cantor Colburn LLP

(57) ABSTRACT

A method for manufacturing a flexible structure including implanting ionic species in first and second source substrates so as to form first and second embrittlement regions respectively, delimiting first and second thin films, providing a flexible substrate, the stiffness R of which is less than or equal to $10^7$ GPa·µm³, securing the first and second thin films to the first and second faces of the flexible substrate respectively so as to form a stack including the flexible structure delimited by the first and second embrittlement regions, the flexible structure having a stiffening effect suitable for allowing transfers of the first and second thin films, and applying a thermal budget so as to transfer the first and second thin films onto the flexible substrate.

14 Claims, 3 Drawing Sheets

MANUFACTURING A FLEXIBLE STRUCTURE BY TRANSFERS OF LAYERS

TECHNICAL FIELD

The present invention relates to a method for manufacturing a flexible structure suitable for being grasped, notably for applying at least one microtechnology, microelectronics or cleaning step.

The invention also relates to an intermediate structure and a flexible structure. The manufacturing method and the flexible structure may notably find application in the field of flexible technologies, of microtechnology, microelectronics, flexible electronics such as chip cards, smart textiles and notably for manufacturing strain gauges.

BRIEF DESCRIPTION OF RELATED ART

The field of flexible technologies requires formation of electronic devices on or in elastically deformable thin films consisting of a single-crystal material, with a thickness of for example less than 5 micrometers. Now, flexible films of a single-crystal material are not very available as such, and flexible films if they exist or are made without any support, are too thin for being able to be handled easily, notably by standard means of microelectronics. The films actually tend to be wound on themselves, to deform or to fold, which makes their use difficult in the manufacturing of electronic devices.

Growing thin films of single-crystal material on existing flexible substrates, such as polymers or metal sheets is impossible because these substrates do not have a surface seed suitable for growing a single-crystal material of the desired quality.

Moreover, the transfer of very thin films onto flexible substrates by the Smart Cut™ technology using an embrittled source substrate is difficult to obtain. Sometimes, only a portion of the film is transferred. This is explained because the flexible substrate does not provide the required stiffness for development along a plane or region of embrittlement of the cavities formed by implantation in the source substrate. The cavities then develop in all directions and in particular along an axis perpendicular to the embrittlement plane or region, which may cause blistering of the film.

On the other hand, it is possible to transfer a thin film from a source substrate in single-crystal material onto a flexible substrate, such as a polymer, by inserting a stiffening film between the thin film and the flexible substrate. If the obtained structure is actually flexible, it may be difficult to use in technological processes subsequently. The structure generally has strong (flexural or torsional . . . ) deformation at room temperature because of the stresses stored in the different films during the manufacture of the structure.

BRIEF SUMMARY

The invention overcomes this drawback and proposes a flexible structure which may be handled, including a thin film in a single-crystal material and for which the spontaneous bow (i.e. in the absence of external stress and at room temperature) is small, so as to be able to carry out steps of microtechnologies or microelectronics in or at the surface of the thin film.

For this purpose and according to a first aspect, the invention provides a method for manufacturing a flexible structure, characterized in that the method comprises the following steps:

implanting ionic species in a first source substrate so as to form a first embrittlement region delimiting a first thin film, notably comprising a single-crystal material, implanting ionic species in a second source substrate so as to form a second embrittlement region delimiting a second thin film, notably comprising a single-crystal material, providing a flexible substrate, the stiffness R of which is less than or equal to $10^7$ GPa·μm³, securing the first and second thin films to the first face and the second face, respectively, of the flexible substrate so as to form a stack including the flexible structure, delimited by the first and second embrittlement regions, the flexible structure having a stiffening effect suitable for allowing transfers of the first and second thin films, and applying a fracture thermal budget for transferring the first and second thin films onto the flexible substrate.

With the method it is thereby possible to obtain a flexible structure having a spontaneous radius of curvature of more than 20 cm, preferably more than 50 cm, and still preferably more than 1 m.

This structure, if moreover it has sufficient dimensions (typically of more than a few mm), may be handled easily. This is the case with standard dimensions of substrates, for example, 100 or 200 mm in diameter. This structure is suitable for being grasped, it is notably possible to apply to it at least one microtechnology, microelectronics or cleaning step.

The stiffness R may be calculated by applying the formula $R=EH^3/12(1-v^2)$. E represents the value of Young's modulus of the material of the flexible substrate (in GPa), H corresponds to the height or to the thickness of the substrate (in micrometers) and v(nu) corresponds to the Poisson coefficient of the material (dimensionless). The flexural rigidity or stiffness of the flexible substrate is low so as to allow a quite substantial elastic deformation upon applying an external stress for example. As a comparison, a stiff silicon substrate having a commercial thickness of 725 micrometers, for which Young's modulus is about 130 GPa and for which the elastic deformation capacities are very low, has a stiffness of the order of $4 \cdot 10^9$ GPa·μm³.

The 'radius of curvature' ρ for a cylindrical structure is obtained by applying the formula $r^2/2\Delta$ with r representing the radius of this structure and Δ (delta) the bow assumed by this structure, measured at the centre of the surface of this structure. For example, a bow of 5 mm corresponds to a radius of curvature of 1 m for a structure with a radius of 100 mm (or 8 inches).

The expression 'spontaneous radius of curvature' describes the radius of curvature intrinsic to the flexible structure when it is not subject to any external stress and at room temperature.

By the expression of 'flexible structure', is meant in the present document, a deformable, conformable structure, which may be elastically deformed upon applying subsequent external stresses, notably provided within the scope of a microelectronics or microtechnology operation or during its subsequent use, once the devices are formed. The flexibility of the structure for example guarantees that it may reach a radius of curvature of more than 20 cm, or even 50 cm and even 1 m, while preserving the mechanical and functional integrity of the structure. Unlike plastic deformation, elastic deformation of the flexible structure avoids damaging the materials of the thin films, for example, by forming cracks or failures in the thickness of the film, striction, blistering, separation or delamination of the transferred thin film, so that the materials retain their properties during the manufacturing or during use.

Moreover, it is to be noted that the first face and the second face of the flexible substrate to which are secured the first and second thin films are opposite faces of the flexible substrate.

By the expression 'securing the first and second thin films to the first face and to the second face of the flexible substrate, respectively' is meant, in the present document, the action of securing the exposed surface of the first and second thin films, i.e. the surfaces having undergone implantation of ionic species, at the first face and at the second face of the flexible substrate respectively.

By the expression of 'stiffening effect suitable for allowing transfers of thin films', is meant, in the present document, that the stiffening effect provided by the stiffness of the thin film, cumulated with that brought by the stiffness of the flexible substrate is sufficient for developing cavities of the embrittled region, parallel to the surface of the source substrates. This stiffening effect notably allows transfer of entire thin films onto a flexible substrate without any occurrence of blistering.

By the expression 'thermal budget' is meant, in the present document, the application of a heat treatment over a given period of time.

Thus, it is possible to transfer thin films onto a flexible substrate so as to obtain a flexible and elastically deformable structure. Moreover, the substantially symmetrical configuration of the structure ensures that it may be handled, grasped and especially it may attain a relatively high radius of curvature, i.e. obtain a substantially planar structure in the absence of external stress and on which it is then possible to carry out technological steps.

According to an embodiment, application of the fracture thermal budget is assisted by applying mechanical stresses such as tensile, shear, flexural or torsional stresses so as to complete the effect of the fracture thermal budget. It is thus possible to decrease the temperature or the duration of the fracture thermal budget so as not to damage the flexible substrate in polymer for example.

According to an alternative, before the securing step, the method comprises the steps:
  forming at least one primary stiffening film on the first thin film and/or on the first face of the flexible substrate
  forming at least one secondary stiffening film on the second thin film and/or the second face of the flexible substrate, the cumulated stiffness of the primary and secondary stiffening films being less than or equal to the stiffness R.

By 'stiffening film' is meant a film having a stiffness greater than that of the flexible substrate for a same thickness. The stiffening film is positioned adjacent to the thin films. Thus, the flexible structure comprises the flexible substrate, the first and second thin films as well as the primary or secondary stiffening films. The latter complete the stiffening effect brought by the thin films and the supporting substrate so as to facilitate during application of the fracture thermal budget, propagation of the fracture in the embrittled region, along a plane substantially parallel to the surface of the source substrate. The thin films, as well as the flexible substrate are involved to a certain extent in this stiffening effect depending on their own stiffness and on their thickness. Additional stiffening films are only required if with the thin films and the flexible substrate it is not possible to obtain by themselves a sufficient stiffening effect.

The 'primary stiffening film' and 'secondary stiffening film', have similar functions. In certain embodiments, these primary and secondary stiffening films are also similar.

It is thus possible to deposit a first primary stiffening film on a first thin film and a second primary stiffening film on the first face of the flexible substrate so as to achieve direct bonding between the first and second primary stiffening films. The bonding of these first and second stiffening films then leads to the formation of a single primary stiffening film. This direct bonding gives the possibility of obtaining greater adhesion energy favorable to the transfer of the thin film. These deposits may of course be also used for securing the second thin film onto the second face of the flexible substrate, independently or as an addition to the securing of the first thin film, setting into play the first and second primary stiffening films.

The stiffening film may comprise several layers of different materials.

The increase in the stiffness of the structure related to the presence of the primary and secondary stiffening films should be small with respect to the stiffness of the flexible substrate so as to obtain a structure with the desired flexibility, advantageously, this increase does not exceed 50%, or even 20% of the stiffness of the flexible support.

Preferably, the formation of the first and second stiffening films is carried out by deposition.

According to an embodiment, the method comprises the steps
  forming the primary stiffening film on the first thin film,
  forming the secondary stiffening film on the second thin film, and in that the securing step comprises the steps
  forming a first layer of an adhesive material, between the primary stiffening film and the first face of the flexible substrate, and
  forming a second layer of an adhesive material between the secondary stiffening film and the second face of the flexible substrate, the adhesive material is notably selected from divinylsiloxane bis(benzocyclobutene) ("DVS-bis-BCB"), polyimides and photosensitive polymers so as to obtain adhesive bonding between the stiffening films and the flexible substrate. This adhesive bonding is simple to apply. No planarization or cleaning of the surfaces with a lot of accuracy is notably required before depositing the layer of an adhesive material.

Preferably the fracture thermal budget is provided by applying thermo-compression with which adhesive bonding may be obtained. The applied pressure may be located around 10 kPa.

According to one possibility, the layers of an adhesive material are cross-linked with a preliminary heat treatment, carried out before putting the films in contact with each other or of the films in contact with the flexible substrate. Once they are put into contact, the obtained adhesion energy may then be quite low. This is favorable to possible disassembling of the structure at the first or second layers of an adhesive material. This disassembling may be useful notably after manufacturing the desired devices on thin films.

According to another possibility, the layers of an adhesive material are cross-linked during the application of the fracture thermal budget. The obtained bonding energy is thus stronger. This bonding energy also allows application of technological operations which generate substantial stresses in the flexible structure.

Alternatively, the method comprises the steps
  forming the primary stiffening film on the first face of flexible substrate, forming the secondary stiffening film on the second face of the flexible substrate, and the securing step comprises direct bonding between the primary stiffening film and the first thin film and direct bonding between the secondary stiffening film and the second thin film.

According to an embodiment, the first and second source substrates comprise the same material and the implantation steps are carried out under the same conditions (species, doses, energy, . . . ), the transfer of the first and second thin films will then take place simultaneously or in a time-shifted way, upon applying the fracture budget.

According to another embodiment, the steps for implanting ionic species in the first and second source substrates comprise a step for implanting different doses of ionic species in the first and second source substrates. Now, the fracture thermal budget to be applied for obtaining fracture of the source substrate notably depends on the dose of implanted ionic species. Thus, when the doses implanted in both source substrates are different, the respective fractures are obtained with different fracture heat treatments in terms of duration and/or of temperature, notably when the implanted materials are of identical nature. When using source substrates of different materials, implanted with different doses, different fracture thermal budgets may also be required.

According to a possibility for applying the invention, the step for applying the fracture thermal budget comprises:

a first step comprising the application of a first thermal budget so as to transfer one of the first or second thin films onto the flexible substrate; and a second step comprising the application of a second additional thermal budget so as to transfer the other of the first or second thin films onto the flexible substrate.

Advantageously, between the first step for applying the first thermal budget and the second step for applying the second additional thermal budget, the method comprises the application of at least one microtechnology or microelectronics operation in or on the free face of the first or second transferred thin film. The presence of the support also called a negative which is not yet detached from its non-transferred thin film, gives some stiffness to the structure. This stiffness notably gives the possibility of applying steps which may be difficult to carry out on a flexible structure, both thin films of which are transferred, such as surfacing or polishing steps.

According to one possibility, the application of at least one microtechnology or microelectronics operation at least partly provides the second additional thermal budget. In this configuration, the second additional thermal budget may be significantly reduced, which allows decrease in the cycle times and the manufacturing costs.

The method according to the invention typically comprises the application of microtechnology or microelectronics steps applied in or on the free face of the first and/or the second transferred thin film. In the case when the transfer of the films is obtained in two steps between which a technological step has been carried out, this allows at least one other technological step to be performed on the last transferred film. In the case when the transfers of the thin films are obtained in a single step, the resulting structure has a sufficient radius of curvature so as to be able to functionalize both or either one of the thin films, or to carry out methods therein or use them in targeted applications.

According to an alternative, the method comprises a step of selecting materials having different Young's moduli in order to form the primary and secondary stiffening films. This gives the possibility of not being limited by a choice of a single stiffening film material for a same structure.

According to another alternative, the steps for implantations of ionic species in the first and second source substrates comprise a step for implanting ionic species with different energies. In this way, it is possible to obtain thin films with different thickness on either side of the structure, notably when the thin films comprise a same material. It is also possible to obtain thin films with different thickness by this means when the materials of the thin films are different.

Preferably, the first and second thin film have a thickness of less than 5 micrometers and preferably less than 2.5 micrometers so as to be suitable for the desired applications.

According to the alternative embodiment wherein the flexible structure is without any stiffening films, the first and second thin films have a thickness of less than 18 micrometers so as to have a stiffening effect suitable for transferring thin films. Advantageously, the method comprises a step of selecting a different thickness for the primary and secondary stiffening films so as to balance the stresses in the structure according to the nature of the materials of the thin films, the thicknesses of the thin films and/or the materials of the stiffening films, and this in order to obtain a final structure with a high radius of curvature (or substantially planar) in the absence of any external stress and at room temperature.

According to a possibility, the implantation step comprises implanting one or several kinds of ionic species selected from hydrogen, boron, helium or other gases. It is known that co-implantation (notably of hydrogen and helium or hydrogen and boron) may allow a decrease in the temperature of the fracture thermal budget and thereby avoid damaging the material of the flexible substrate, notably when it comprises polymer, Preferably, the primary and secondary stiffening films have a thickness comprised between 0.1 micrometers and 30 micrometers and preferably between 0.5 micrometers and 20 micrometers, a Young's modulus greater than or equal to 10 GPa, and preferably comprise a material in $SiO_xN_y$ such as $SiO_2$, SiOx, SiON, SiN, $Si_3N_4$, SiN:H. $Si_xN_y$, or $Al_xO_y$ such as $Al_2O_3$ so as not to stiffen too much the final flexible structure.

$Si_xN_y$ is defined by the formula $0.2<(y/x)<1.4$.

According to a possible embodiment, the flexible substrate is selected from metal sheets, rubber polymers, glassy polymers such as Kapton®, so as to give the expected flexibility to the flexible structure.

For example, the metal sheets may have a thickness comprised between a few micrometers and 50 micrometers, the glassy polymers with Young's moduli comprised between about 10 GPa and 100 MPa may, as an example, have a thickness around 50-200 micrometers. Rubber polymers with Young's moduli comprised between 0.1 MPa and 20 MPa may, as an example, have a thickness comprised between 50 and 2,000 micrometers.

Preferably, the material of the first and second thin films is a single-crystal material, for example selected from piezoelectric materials, magnetic, semiconducting materials such as a material comprising the elements from column IV, such as Si, SiGe, or a material comprising elements from columns III and V, such as GaN, AlGaN, InGaN, AsGa or InP for example. This may notably be a binary, ternary or quaternary alloy comprising elements from columns III and V such as Ga, N, Al, In, P or As.

According to the embodiment, the materials of the first and second thin films may be of the same nature or of different nature.

According to a possibility, the first and second thin films may be mono- or multi-materials.

According to a second aspect, the invention also relates to an intermediate structure characterized in that it comprises from its base to its surface:
- one of the first or second thin films, secured to a negative of a first or a second embrittled source substrate, respectively,
- one of the primary or secondary stiffening films on said first or second thin film secured to a negative,
- a flexible substrate for which the stiffness R is less than or equal to $10^7$ GPa·µm$^3$,
- another of the primary or secondary stiffening films, the cumulated stiffness of the primary and secondary stiffening films being less than or equal to R,
- another of the first and second thin films, transferred onto the flexible substrate, the transferred thin film having a thickness of less than 5 micrometers and advantageously less than 2.5 micrometers.

By the term of 'transfer' is meant in the present document the action of fracturing a source substrate at the embrittlement region obtained by implantation of ionic species so that the negative of the source substrate is distinct from the thin film, the latter having been secured to the flexible substrate by the transfer.

By the expression of 'transferred thin film' is meant, in the present document, a thin film detached or disconnected from a negative of a source substrate, at an embrittlement region obtained by implantation of ionic species and which has been secured to the flexible substrate. The embrittlement region is globally planar and extends parallel to the surface of the implanted source substrate.

This intermediate structure may be grasped, handled and is flexible because of the presence of the flexible substrate. This intermediate structure remains sufficiently stiff for supporting surfacing steps on the transferred thin film.

According to an alternative embodiment, the stiffness R of the flexible substrate is advantageously less than 7·10$^6$ GPa·µm$^3$.

According to a third aspect, the invention relates to a flexible structure adapted for being grasped, notably for the application of at least one microtechnology, microelectronics or cleaning step, obtained from the intermediate structure as described earlier, characterized in that it comprises from its surface to its base:
- a first thin film with a thickness of less than 5 micrometers,
- a primary stiffening film,
- a flexible substrate for which the stiffness is less than or equal to $10^7$ GPa·µm$^3$,
- a secondary stiffening film,
- a second thin film with a thickness of less than 5 micrometers, the flexible structure having a radius of curvature greater than 20 cm, preferably greater than 50 cm and still preferably greater than 1 m in the absence of external stress.

This conformation ensures that the flexible structure may be handled, while having low spontaneous deformation. The flexible structure may advantageously be elastically deformed according to the targeted applications.

According to a particular embodiment, the flexible structure comprises first and second thin films in a single-crystal material, for example selected from piezoelectric materials, magnetic materials, semiconducting materials, such as a material comprising elements from column IV such as Si, SiGe, or a material comprising elements from columns III and V, such as GaN, AlGaN, InGaN, AsGa or InP, the thin films having a thickness comprised between about 10 nanometers and 5 micrometers,
- primary and secondary stiffening films in a material selected from SiO$_x$N$_y$ such as SiO$_2$, SiO$_x$, SiON, SiN, Si$_3$N$_4$, Si$_x$N$_y$, or Al$_x$O$_y$ such as Al$_2$O$_3$, and having a thickness comprised between 0.1 micrometers and 30 micrometers and preferably between 0.5 micrometers and 20 micrometers,
- a flexible substrate selected from metal sheets, rubber polymers and glassy polymers.

The material of the first and second thin films may notably be a binary, ternary or quaternary alloy comprising elements from columns III and V such as Ga, N, Al, In, P or As.

Preferably, the flexible structure comprises
- first and second thin films including silicon and having identical thickness, comprised between 0.01 micrometers and 2.5 micrometers, advantageously between 0.05 and 1.5 micrometers and still more advantageously between 0.1 to 1 micrometer,
- primary and secondary stiffening films including silicon oxide SiO$_2$ and having an identical thickness, comprised between 0.1 micrometers and 10 micrometers, advantageously between 2 and 6 micrometers,
- a flexible substrate in glassy polymer, such as Kapton®, having a thickness comprised between 100 and 200 micrometers.

BRIEF DESCRIPTION OF THE DRAWINGS

Other aspects, objects and advantages of the present invention will become apparent upon reading the following description of five embodiments thereof, given as non-limiting examples and made with reference to the appended drawings. The figures do not necessarily observe the scale of all the illustrated elements so as to improve their legibility. Dotted lines symbolize first and second regions of embrittlement in the source substrates. The embrittlement region is globally planar and extends parallel to the surface of the implanted source substrate. In the following of the description, for the sake of simplification, identical, similar or equivalent elements of the different embodiments bear the same numerical references.

DETAILED DESCRIPTION

Figure 1A:
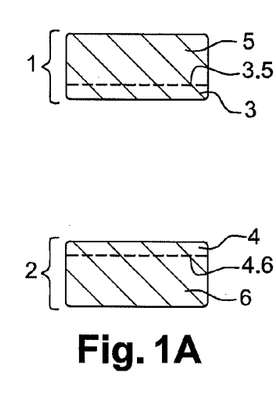
FIGS. 1A to 1E illustrate steps of a method for manufacturing a flexible structure according to a first embodiment of the invention.

With reference to FIG. 1A, the method is applied from two bulk source substrates 1, 2 in single-crystal silicon with a thickness of about 725 micrometers. The embrittlement regions 3.5, 4.6 of the first and second source substrates 1, 2 are obtained by implantating two ionic species kinds, boron and hydrogen. This implantation, commonly called a co-implantation, is practiced under the same conditions in both source substrates 1, 2. The implantation is carried out with doses of $10^{15}$ B/cm$^2$ and $4·10^{16}$ H/cm$^2$ with respective energies of 80 keV and 27 keV so as to delimit the first and second thin films 3, 4 and first and second negatives 5, 6 in the respective source substrates 1, 2. This co-implantation of boron and hydrogen is particularly efficient for reducing the temperature of the thermal budget to be applied for transferring thin silicon films. In this way, the temperature is advantageously sufficiently low so as not to generate any damage in the flexible substrate 1, 2, notably when the latter comprises a polymer.

Figure 1B:
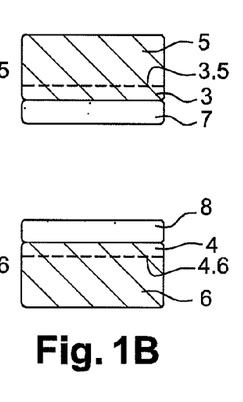

With reference to FIG. 1B, primary and secondary stiffening films 7, 8 comprising $SiO_2$ are deposited by a chemical vapor deposition technique such as CVD on the first and second thin films 3, 4 respectively until a thickness of the order of 3 micrometers is reached. The depositions of the stiffening film 7, 8 are carried out at a temperature of about 250° C. so as not to fracture the source substrates 1, 2. Nevertheless, this deposition step still provides a preliminary thermal budget which allows a reduction in duration or in temperature of the subsequent fracture thermal budget. Any other method for depositing a stiffening film 7, 8 may be used insofar that the thermal budget resulting from it does not cause any fracture.

Figure 1C:
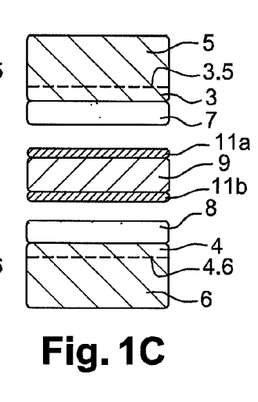

With reference to FIG. 1C, a flexible substrate 9 comprising a polymer of the Kapton® type with a thickness of 125 micrometers is provided for being secured with the first and second thin films 3, 4. First and second layers of an adhesive material 11a, 11b in DVS-bis-BCB are respectively deposited on first and second faces of the flexible substrate 9 by centrifugal coating or a spin-on deposition, a method well known to one skilled in the art under the name of 'spin coating'. Alternatively, the first and second layers of an adhesive material 11a, 11b may also be deposited on the free faces of the primary and secondary stiffening films 7, 8 respectively. The thickness of the layers of an adhesive material 11a, 11b may vary for example from 0.5 micrometers to more than 10 micrometers.

Figure 1D:
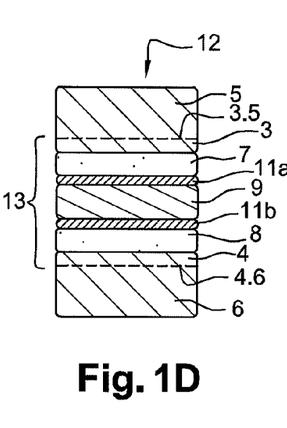

With reference to FIG. 1D, the first and second thin films 3, 4, covered with stiffening films 7, 8, are then put into contact with the first and second faces respectively of the flexible substrate 9. The thereby obtained stack 12 is placed in a piece of thermocompression equipment (not shown) for obtaining adhesive bonding. A pressure to the order of 10 kPa and a temperature of 300° C. is then applied for about one 1 h 45 mins. The thermocompression also provides the fracture thermal budget and induces cross-linking of the layers of a DVS-bis-BCB adhesive material 11a, 11b.

Figure 1E:
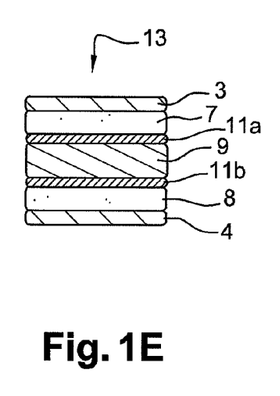

With reference to FIG. 1E, the thin films 3, 4 with a thickness of about 0.35 micrometers, are transferred onto the flexible substrate 9 of Kapton® so as to form the flexible structure 13. The polymer substrate 9 with a thickness of 125 micrometers provides a stiffness R of less than or equal to $1.5·10^6$ GPa·µm$^3$. The stiffness of each of the stiffening films 7, 8 gives the possibility of ensuring proper development of the cavities in order to obtain a sharp substantially planar fracture at the embrittled region, which would not be obtained with the single flexible substrate 9. However, the thickness of the $SiO_2$ stiffening film 7, 8 is selected so that the cumulated stiffness brought by these films remains less or equal to the stiffness R of the flexible substrate. This gives the possibility of imparting the expected flexibility to the flexible structure 13 and to the silicon single-crystal thin films 3, 4. The obtained flexible structure 13 may actually deform elastically under the action of an external stress, while remaining able to be grasped and handled. Moreover, the symmetry of the structure 13 gives the possibility of balancing the stresses generated during the manufacturing, for example related to the conditions for depositing the materials, the influence of the difference in TECs of the materials during changes in temperature. Within the scope of the invention, the obtained structure 13 has substantially symmetrical stresses relatively to the flexible substrate and consequently retains a very large radius of curvature or a very small bow for example of less than 3 mm for a diameter of 200 mm. The flexible structure 13 may therefore be handled and is suitable for performing microtechnology or microelectronics steps.

According to non-illustrated possibility, it is possible to reuse the negatives 5, 6 of the source substrates 1, 2 and to recycle them for a new transfer.

According to a non-illustrated alternative, it is also possible to proceed with direct bonding between the stiffening films and the flexible substrate if the latter allows this. In this case, the faces to be assembled may be subject, prior to bonding, to adequate preparations for making them compatible with such bonding, notably in terms of roughness and hydrophilicity/hydrophobicity.

Figure 2A:
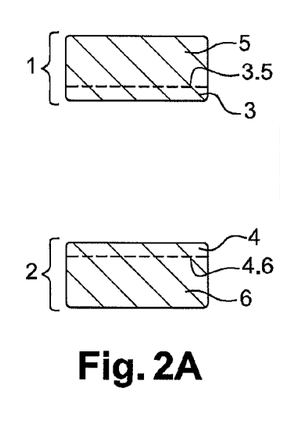
FIGS. 2A to 2E illustrate steps of a method for manufacturing a flexible structure according to a second embodiment of the invention.

According to a second embodiment, with reference to FIG. 2A, a co-implantation with doses of $10^{15}$ B/cm$^2$ and $4·10^{16}$ H/cm$^2$ and energies of 250 keV and 70 keV respectively is carried out in an identical way in both source substrates 1, 2 in silicon. The implantation energies are larger than those of the first embodiment, which corresponds to also larger thin film thicknesses 3, 4.

Figure 2B:
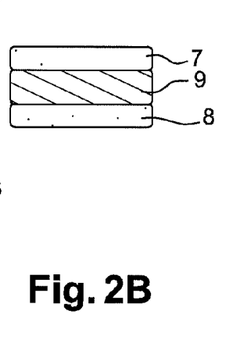

With reference to FIG. 2B, stiffening films 7, 8 of $SiO_2$ are deposited by CVD at a temperature of the order of 250° C. on the first and second faces of a flexible substrate 9 of the Kapton® type identical with the one used earlier. Any other deposition method suitable for forming thin films may be used insofar that the deposition temperature does not exceed a temperature which may damage the flexible substrate 9. The thicknesses of each of the deposited stiffening films 7, 8 are identical, they may vary between 4 and 6 micrometers for example.

Figure 2C:
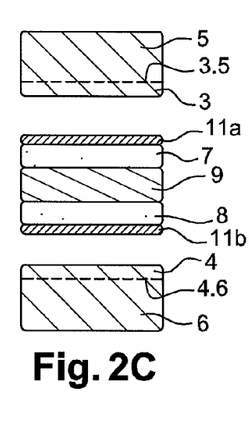

According to an alternative illustrated in FIG. 2C, first and second layers of an adhesive material 11a, 11b are deposited on the exposed faces of the stiffening film 7, 8 and are then put into contact with the embrittled source substrates 1, 2 before being cross-linked. The thickness of these adhesive material layers should allow oedometric compression in order to obtain the stiffening effect during the application of the thermal budget for the fracture. For example, a thickness of 0.1 micrometers may be selected. It is notably possible to refer to the teaching of the French application filed under the number FR10/54969, the contents of which should be considered as being part of the present application, for applying the required stiffening effect in order to obtain fracture in different scenarios.

Figure 2D:
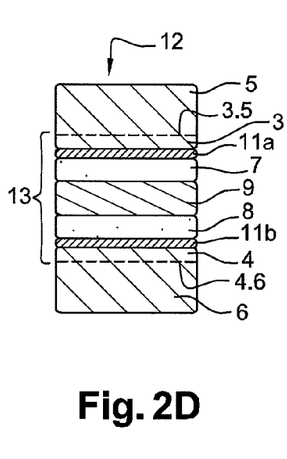

With reference to FIG. 2D, the obtained stack 12 is loaded on board a piece of thermocompression equipment, wherein a pressure of the order of 10 kPa is applied at a temperature of 250° C. for about 14 h in order to reach the fracture thermal budget.

Figure 2E:
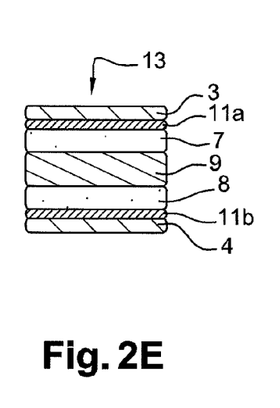

With reference to FIG. 2E, the thin films 3, 4 with a thickness of about 0.68 micrometers are transferred onto the flexible substrate 9 of Kapton® which allows a flexible structure 13 to be obtained, for which the spontaneous radius of curvature is greater than 1 m. This flexible structure 13 may be handled, conformed and adapted to the carrying out of microtechnology or microelectronic steps for the same reasons as those explained above.

The cross-linking of the layers of an adhesive material 11a, 11b before the contacting of the surfaces to be adhesively bonded, leads to obtaining a less substantial adhesive bonding energy than when the cross-linking is carried out after the contacting of the surfaces. This may be advantageous if it is desired to dissassemble the flexible structure 13 so as to isolate or transfer thin films on other substrates after functionalization for example.

Figure 3A:
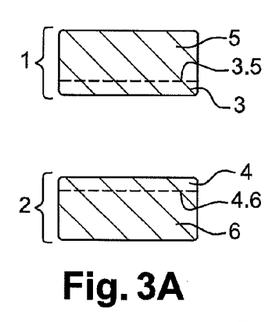
FIGS. 3A to 3F illustrate steps of a method for manufacturing a flexible structure according to a third embodiment of the invention.

According to a third embodiment, with reference to FIG. 3A, co-implantation of boron and hydrogen is carried out with different doses in a first substrate 1 and a second substrate 2 in silicon. Doses of $10^{15}$ B/cm$^2$ and of $4 \cdot 10^{16}$ H/cm$^2$ with respective energies of 80 keV and 27 keV are implanted in a first source substrate 1. The second source substrate 2 receives doses of $10^{15}$ B/cm$^2$ and of $3 \cdot 10^{16}$ H/cm$^2$ implanted with respective energies of 80 keV and 27 keV. The implanted doses having direct incidence on the fracture thermal budget, both thin films 3, 4 may then be fractured and transferred according to two different thermal budgets.

Figure 3B:
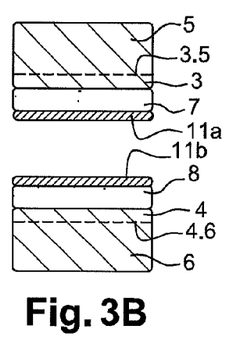

With reference to FIG. 3B, primary and secondary stiffening films 7, 8 in SiO$_2$ are respectively deposited on the first and second thin films 3, 4 by CVD and a temperature of about 250° C. First and second layers of an adhesive material 11a, 11b, such as DVS-bis-BCB, are deposited on the exposed faces of the stiffening films 7, 8.

Figure 3C:
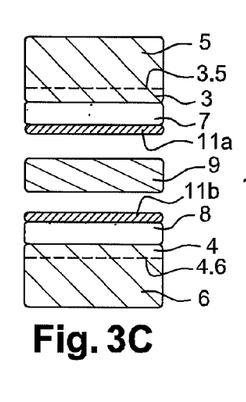

With reference to FIG. 3C, both embrittled source substrates 1, 2 are put into contact with a flexible substrate 9 of the Kapton® type before cross-linking of the DVS-bis-BCB.

Figure 3D:
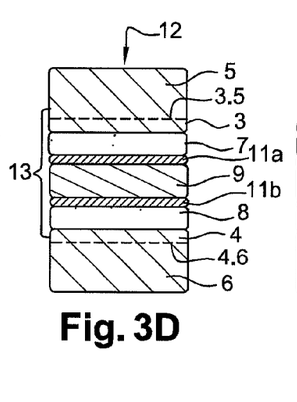

With reference to FIG. 3D, the obtained stack 12 is placed in a piece of thermocompression equipment in which a first thermal budget is applied at a temperature of 300° C. for about 1 h 45 mins with a pressure of the order of 10 kPa.

Figure 3E:
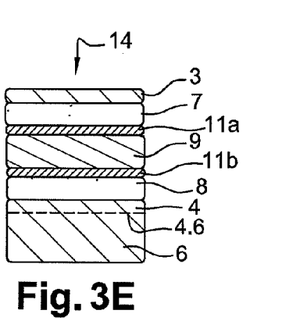

With reference to FIG. 3E, the first thermal budget leads to obtaining an intermediate structure 14 resulting from the transfer of a single first thin film 3 with a thickness close to 0.35 micrometers. It is then possible for example, to apply surfacing or polishing operations to the first single-crystal thin film 3, or other microelectronics or microtechnology steps easier to apply on the intermediate structure 14 still secured to the second negative 6 on the final flexible structure 13.

Figure 3F:
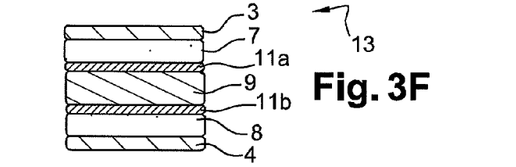

With reference to FIG. 3F, a second additional thermal budget is applied to the intermediate structure 14 at a temperature of 300° C. for 18 h. The result of this is the transfer of the second thin film 4 with a thickness close to 0.35 micrometers and the formation of a flexible structure 13 which may be handled and for which the spontaneous radius of curvature is greater than 1 m.

According to a fourth embodiment, with reference to FIGS. 4A to 4E, the method is set into place by using direct bonding between the first and second thin films 3, 4 and the primary and secondary stiffening films 7, 8.

Figure 4A:
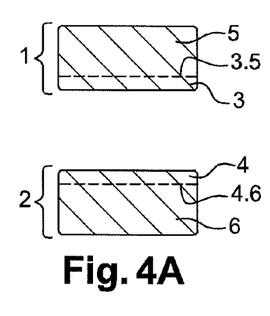
FIGS. 4A to 4E illustrate steps of a method for manufacturing a flexible structure according to a fourth embodiment of the invention.

With reference to FIG. 4A, co-implantation with doses of $10^{15}$ B/cm$^2$ and of $4 \cdot 10^{16}$ H/cm$^2$ and energies of 250 keV and 70 keV respectively is carried out identically in both source substrates 1, 2 in silicon.

Figure 4B:
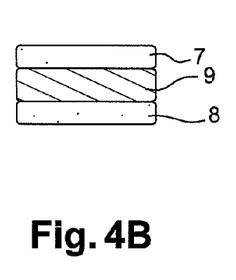

With reference to FIG. 4B, stiffening films 7, 8 in SiO$_2$ are deposited by CVD at a temperature of the order of 250° C. on the first and second faces of a flexible substrate 9 of the Kapton® type identical with the one used earlier.

Figure 4C:
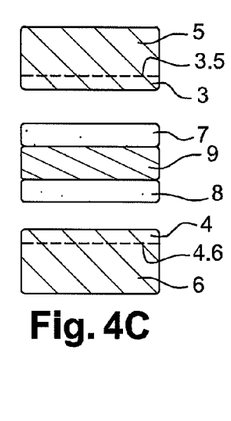

With reference to FIG. 4C, the surfaces of the thin films 3, 4 and the surfaces of the stiffening film 7, 8 are prepared for direct bonding, notably in terms of roughness and hydrophilicity/hydrophobicity.

Figure 4D:
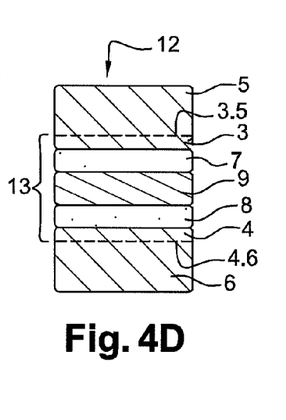

With reference to FIG. 4D, the prepared surfaces are put into contact in order to carry out securing of the latter. Next, a fracture thermal budget is applied to the obtained stack 12 at a temperature of 250° C. for about 14 h.

Figure 4E:
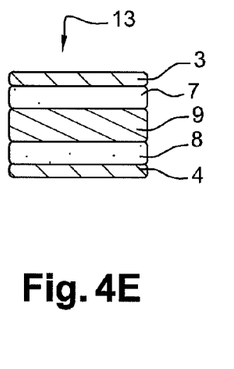

With reference to FIG. 4E, the thin films 3, 4 with a thickness of about 0.68 micrometers are transferred onto the flexible substrate 9 of Kapton® which allows a flexible structure 13 to be obtained, the spontaneous radius of curvature of which is greater than 1 m. This flexible structure 13 may be handled, conformed and adapted to the carrying out of microtechnology or microelectronic steps for the same reasons as the ones explained above.

Figure 5A:
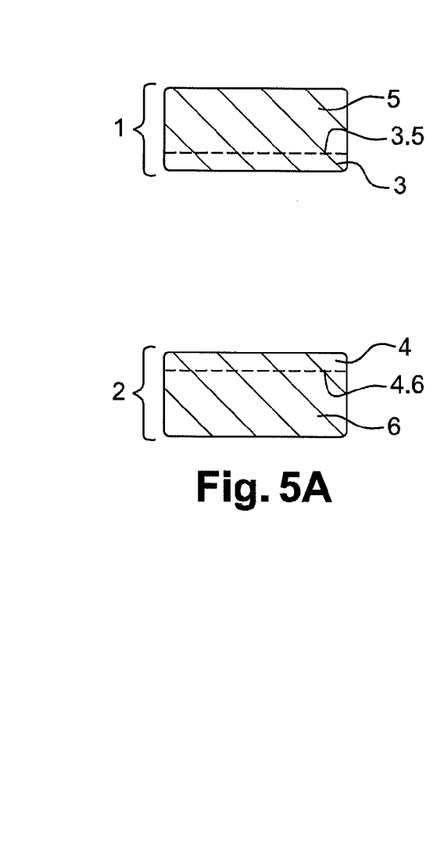
FIGS. 5A to 5D illustrate steps of a method for manufacturing a flexible structure according to a fifth embodiment of the invention.
Figure 5B:
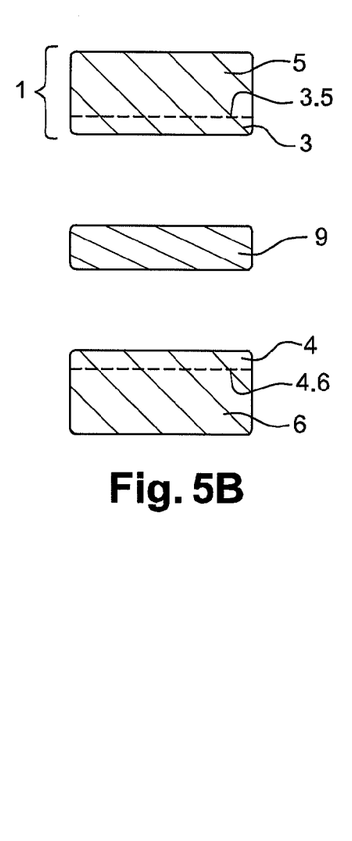
Figure 5C:
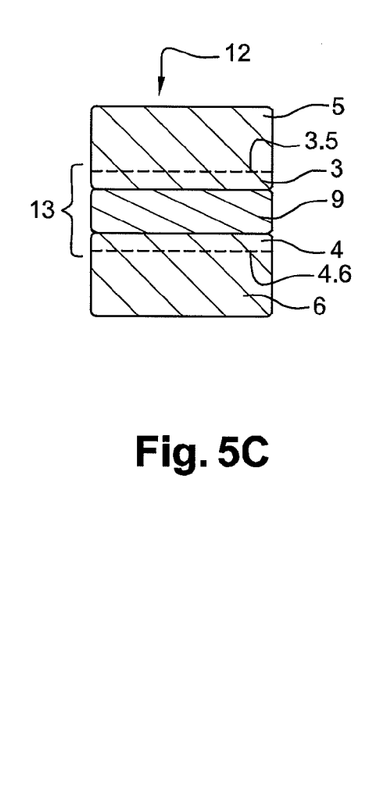
Figure 5D:
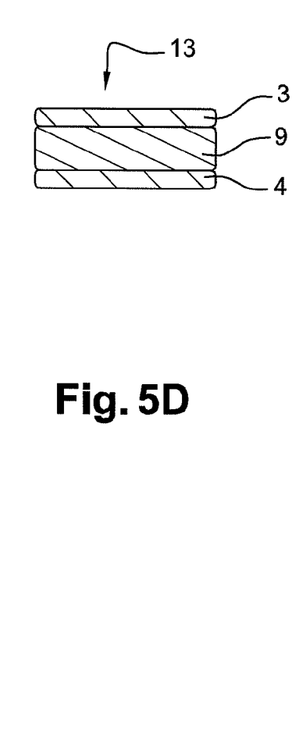

According to a fifth embodiment, with reference to FIGS. 5A and 5D, the flexible structure 13 made is without any stiffening films. The stiffening effect of the flexible structure 13 suitable for transfer of thin films is then obtained by selecting the materials of the flexible substrate and of the thin films and by adapting the thicknesses of the latter accordingly.

With reference to FIG. 5A, the method is applied from two bulk source substrates 1, 2 in single-crystal silicon. The embrittlement regions 3. 5, 4. 6 of the first and second source substrates 1, 2 are made at about a depth of 15 microns. Thin films 3, 4 are thereby delimited, the stiffness of which is sufficient by itself for obtaining the stiffening effect required for the fracture. Such films may for example be obtained by implanting hydrogen with energies above 500 keV (for example of the order of one MeV).

With reference to FIG. 5B, a flexible substrate 9 comprising a flexible metal sheet, with a thickness for example of 15 microns, is provided for securing with the first and second thin films 3, 4. The use of a metal sheet has the advantage of withstanding higher temperatures than the majority of the polymers so that it is possible to apply a thermal budget for which the temperature is greater.

With reference to FIG. 5C, the first and second thin films 3, 4 are then adhesively bonded by direct bonding with the first and second faces of the flexible substrate 9 respectively. The stack 12 is then subject to a temperature of the order of 450° C. or 500° C. for obtaining the fracture.

With reference to FIG. 5D, the thin films 3, 4 are transferred onto the flexible substrate 9 so as to form the flexible structure 13. The stiffness of each of the thin films 3, 4 and of the flexible substrate 9 gives the possibility of ensuring good development of the cavities for obtaining a sharp fracture, substantially planar at the embrittled regions 3, 5, 5, 6, which would not be obtained with the single flexible substrate 9. The obtained flexible structure 13 is substantially planar and may elastically deform under the action of an external stress while remaining able to be grasped and handled.

According to a non-illustrated alternative, the nature of the materials of the primary and secondary stiffening films may be different on either side of the flexible substrate. The various stresses (related to the deposition conditions, to the different thermal expansion coefficients of the materials making up the flexible structure) and the various Young moduli may be taken into account, in order to easily adapt, with the help of standard mechanics text books if required, the thicknesses of the stiffening films so as to obtain a comparable influence on each side of the flexible support. With this it is possible to obtain a final flexible structure with or very little deformations in the plane at room temperature in the absence of an external stress. The generated structure is flexible because of the flexible substrate which may be handled, for subsequent technological operations. According to a non-illustrated example, the method is applied from two bulk source substrates in single-crystal silicon. The embrittlement planes of the first and second source substrates are obtained by co-implantation of boron and hydrogen with doses of $10^{15}$ B/cm$^2$ and of $4·10^{16}$ H/cm$^2$ and energies of 250 keV and 70 keV, respectively.

Primary and secondary stiffening films, comprising silicon oxide SiO$_2$ and of silicon nitride Si$_x$N$_y$, respectively, are deposited on the first and second thin films with a thickness of the order of 7 micrometers and of the order of 2 micrometers, respectively. The silicon nitride Si$_x$N$_y$ is generally defined by the formula: $0.2<(y/x)<1.4$.

The depositions of the stiffening films are carried out so that they do not have any stress on the source substrates at a temperature of 300° C.

A flexible substrate comprising a polymer of the Kapton® type with a thickness of 125 micrometers is provided for securing with the first and second thin films. First and second layers of an adhesive material in DVS-bis-BCB are respectively deposited on each of the stiffening films by spin coating or spin-on deposition. Alternatively, the first and second layers of an adhesive material may also be deposited on at least one of the surfaces of the flexible substrate. The thickness of the layers of an adhesive material may for example vary from 0.1 micrometers to more than 10 micrometers.

The first and second thin films, covered with the primary and secondary stiffening films are then put into contact with the first and second faces of the flexible substrate, respectively.

The stack is then treated in order to obtain an adhesive bonding, for example by using a pressure of the order of 10 kPa at a temperature of 300° C. applied for about 1 h 45 mins.

The thin films with a thickness of about 0.65 μm are transferred onto the flexible substrate of Kapton® so as to form the flexible structure, the stiffening films being in an intermediate position between the thin films and the flexible substrate.

The bow of the obtained flexible structure is very small, for example it is less than about 5 mm for a flexible structure diameter of 200 mm.

According to another example wherein all the parameters described above have been preserved except for the thickness of the primary stiffening oxide film which is smaller, about 6.75 μm, the bow of the obtained flexible structure is of the order of a few hundred micrometers.

Moreover, the first and second source substrates may be implanted with different energies. In particular, the implantation energies may be more or less high, which corresponds to the generation of the first and second thin films with different thicknesses. Taking into account the Young moduli of the materials used, and the difference in thickness of the thin films, it is possible to infer the difference to be applied for the thickness of the stiffening films. For example, the method is applied from two bulk source substrates in single-crystal silicon. Implantation in the first source substrate is achieved by co-implantation of $10^{15}$ B/cm$^2$ and $4·10^{16}$ H/cm$^2$, with respective energies of 250 keV and 70 keV. Implantation in the second source substrate is achieved by co-implantation of $10^{15}$ B/cm$^2$ and of $4·10^{16}$ H/cm$^2$ and with energies of 80 keV and 27 keV.

Primary and secondary stiffening films are deposited on the first and second thin films, comprising silicon oxide SiO$_2$ and silicon nitride Si$_x$N$_y$, respectively with a respective thickness to the order of 6.5 μm and of the order of 2 μm.

First and second layers of an adhesive material in DVS-bis-BCB are respectively deposited on each of the stiffening films before they are in contact with the first and second faces of the flexible substrate respectively.

A pressure of the order of 10 kPa at a temperature of 300° C. is then applied to the structure for about 1 h 45 mins.

The first thin film with a thickness of about 0.65 micrometers and the second thin film with a thickness of about 0.35 μm are transferred onto the flexible Kapton® substrate and form the flexible structure which has a very small bow. It is less than about 3 mm for a flexible structure diameter of 200 mm.

According to an alternative, co-implantation of $10^{15}$ B/cm$^2$ and of $4·10^{16}$ H/cm$^2$ with respective energies of 80 keV and 27 keV is achieved in the first source substrate of silicon. Co-implantation of $10^{15}$ B/cm$^2$ and of $4·10^{16}$ H/cm$^2$ with respective energies of 250 keV and 70 keV is achieved in the second source substrate of silicon.

In this example, a primary silicon oxide stiffening film with a thickness of 7.25 μm is deposited on the first thin film. A secondary stiffening film of silicon nitride with a thickness of 2 micrometers is deposited on the second thin film. The flexible support is in Kapton, with a thickness of 125 μm. All the other parameters described earlier were retained.

The first transferred thin film has a smaller thickness, of about 0.35 micrometers and the second thin film has a thickness of about 0.65 micrometers. The bow of the obtained flexible structure is of the order of a few hundred micrometers.

According to the same principle, the materials of the single-crystal thin films may be different on either side of the flexible substrate, and therefore have different stiffness, which may induce different deformations at the structure. By taking into account the difference in Young moduli of the materials of the thin films to be transferred as well as their difference in stiffness, it is possible to infer the difference in the thicknesses of the stiffening films to be applied. For example, if a material of a first thin film has stiffness below that of the material of a second thin film, the thickness of the primary stiffening film will be larger than that of the secondary stiffening film in order to balance the stresses.

In a non-illustrated alternative, it is also possible to use first and second layers of an adhesive material of different natures on either side of the flexible substrate. Adhesives formed with rubber polymers remain practically without any incidence on the stiffness of the flexible structure. On the other hand, these adhesives may affect the flatness of the structure, if the induced stresses on the flexible substrate are no longer symmetrical. One skilled in the art will have to take this into account and do what is necessary notably by acting on the selection of the adhesives and on their thickness for preserving symmetry.

According to another non-illustrated alternative, the first and second source substrates may include a composite structure comprising single-crystal thin films of diverse natures, deposited by epitaxy on a seed support substrate comprising another material.

Of course, the deposition of the first and second stiffening films may be carried out in two successive steps. In the same way, the step for securing both thin films to the flexible substrate by direct adhesive bonding or via an adhesive film may also be carried out in two successive steps.

According to another non-illustrated alternative, the method of the invention may also be applied by depositing the primary stiffening film on the first thin film and depositing the secondary stiffening film on the second face of the flexible substrate or vice versa.

Moreover, the securing of the first thin film onto the first face of the flexible substrate may be applied by adhesive bonding while the securing of the second thin film onto the second face of the flexible substrate may be performed by direct bonding or vice versa.

According to a non-illustrated alternative, a single implantation of hydrogen at 25 keV and with a dose of $10^{17}$ H/cm$^2$ into silicon gives the possibility of obtaining fracture at 250° C. within 15 hours. According to another further non-illustrated alternative, co-implantation of helium (60 keV, 4·10$^{16}$ He/cm$^2$) and of hydrogen (32 keV, 4·10$^{16}$ H/cm$^2$) into silicon gives the possibility of obtaining fracture at 300° C. within 20 hours. These conditions give the possibility of obtaining fractures with a low thermal budget, compatible with the flexible substrate, in the same way as in the case of a co-implantation of hydrogen and of boron.

It is obvious that the invention is not limited to the embodiments described above as examples but it comprises all the technical equivalents and alternatives of the means described as well as their combinations.

The invention claimed is:

1. A method for manufacturing a flexible structure, wherein the method comprises the following steps:
    implanting ionic species in a first source substrate so as to form a first embrittlement region delimiting a first thin film comprising a single-crystal material;
    implanting ionic species in a second source substrate so as to form a second embrittlement region delimiting a second thin film comprising a single-crystal material;
    providing a flexible substrate, a stiffness R of which is less than or equal to $10^7$ GPa·µm$^3$;
    securing the first and second thin films respectively to the first face and to the second face of the flexible substrate so as to form a stack including the flexible structure delimited by the first and second embrittlement regions, the flexible structure having a stiffening effect suitable for allowing transfers of the first and second thin films; and
    applying a fracture thermal budget for transferring the first and second thin films onto the flexible substrate.

2. The method according to claim 1, wherein before the securing step, the method comprises the steps:
    forming at least one primary stiffening film on the first thin film, and
    forming at least one secondary stiffening film on the second thin film, the cumulated stiffness of the primary and secondary stiffening films being less than or equal to the stiffness R.

3. The method according to claim 2, wherein the method comprises the steps
    forming the primary stiffening film on the first thin film;
    forming the secondary stiffening film on the second thin film and wherein the securing step comprises the steps:
    forming a first layer of an adhesive material, between the primary stiffening film and the first face of the flexible substrate; and
    forming a second layer of an adhesive material between the secondary stiffening film and the second face of the flexible substrate, the adhesive material comprising at least one of divinylsiloxane bis(benzocyclobutene) ("DVS-bis-BCB"), polyimides and photosensitive polymers.

4. The method according to claim 2, wherein the method comprises selecting a different thickness for the primary and secondary stiffening films.

5. The method according to claim 2, wherein the primary and secondary stiffening films have a thickness comprised between 0.1 micrometers and 30 micrometers, a Young's modulus greater than or equal to 10 GPa, and comprises a material in $SiO_xN_y$, or in $Al_xO_y$.

6. The method according to claim 1, wherein before the securing step, the method comprises the steps:
    forming at least one primary stiffening film on the first face of the flexible substrate; and
    forming at least one secondary stiffening film on the second face of the flexible substrate, the cumulated stiffness of the primary and secondary stiffening films being less than or equal to the stiffness R.

7. The method according to claim 6, wherein the method comprises the steps:
    forming the primary stiffening film on the first face of the flexible substrate;
    forming the secondary stiffening film on the second face of the flexible substrate;
    and wherein the securing step comprises direct bonding between the primary stiffening film and the first thin film and direct bonding between the secondary stiffening film and the second thin film.

8. The method according to claim 1, wherein before the securing step, the method comprises the steps:
    forming at least one primary stiffening film on the first face of the flexible substrate; and
    forming at least one secondary stiffening film on the second thin film, the cumulated stiffness of the primary and secondary stiffening films being less than or equal to the stiffness R.

9. The method according to claim 1, wherein the steps for implanting ionic species into the first and second source substrates comprise a step for implanting different doses of ionic species into the first and second source substrates.

10. The method according claim 9, wherein the step for applying the fracture thermal budget comprises:
    a first step comprising the application of a first thermal budget so as to transfer one of the first or second thin films on to the flexible substrate; and
    a second step comprising the application of a second additional thermal budget so as to transfer the other one of the first and second thin films onto the flexible substrate.

11. The method according to claim 1, wherein the method comprises the application of at least one microtechnology or microelectronics step applied in or on the free face of the first transferred thin film.

12. The method according to claim 1, wherein the method comprises the application of at least one microtechnology or microelectronics step applied in or on the free face of the first transferred thin film and of the second transferred thin film.

13. The method according to claim 1, wherein the flexible substrate comprises at least one of metal sheets, rubber polymers, and glassy polymers.

14. The method according to claim 1, wherein the material of the first and second thin films is a single-crystal material comprising at least one of piezoelectric materials, magnetic materials, semiconducting materials, and a material comprising elements from columns III and IV.

* * * * *